(12) United States Patent
Kranz et al.

(10) Patent No.: US 7,368,312 B1
(45) Date of Patent: May 6, 2008

(54) MEMS SENSOR SUITE ON A CHIP

(75) Inventors: Michael Scott Kranz, Madison, AL (US); Robert Faye Elliott, Madison, AL (US); Michael Ray Whitley, Madison, AL (US); Marty Ray Williams, Huntsville, AL (US); Philip John Reiner, Huntsville, AL (US)

(73) Assignee: Morgan Research Corporation, Huntsville, AL (US)

( * ) Notice: Subject to any disclaimer, the term of this patent is extended or adjusted under 35 U.S.C. 154(b) by 131 days.

(21) Appl. No.: 11/251,740

(22) Filed: Oct. 17, 2005

Related U.S. Application Data

(60) Provisional application No. 60/619,421, filed on Oct. 15, 2004.

(51) Int. Cl.
*H01L 21/00* (2006.01)
(52) U.S. Cl. .......................... 438/48; 438/50; 257/414
(58) Field of Classification Search .................. 438/48
See application file for complete search history.

(56) References Cited

U.S. PATENT DOCUMENTS

2005/0160814 A1* 7/2005 Vaganov et al. ......... 73/514.01

OTHER PUBLICATIONS

Gary K. Fedder, Qi Jing, NODAS 1.3—Nodal Design of Actuators and Sensors, Oct. 27-28, 1998, BMAS '98: IEEE/VIUF Int. Workshop on Behavioral Modeling and Simulation, Orlando, FL, USA.
Mark Lemkin, Bernhard E. Boser, A Three-Axis Micromachined Accelerometer with a CMOS Position-Sense Interface and Digital Offset-Trim Electronics, IEEE Journal of Solid-State Circuits, vol. 34, No. 4, Apr. 1999.

* cited by examiner

*Primary Examiner*—Kiesha Rose
*Assistant Examiner*—Kimberly Trice
(74) *Attorney, Agent, or Firm*—Greenberg Traurig LLP; Paul F. McQuade; John Wittenzellner

(57) ABSTRACT

The MEMS Sensor Suite on a Chip provides the capability, monolithically integrated onto one MEMS chip, to sense temperature, humidity, and two axes of acceleration. The device incorporates a MEMS accelerometer, a MEMS humidity sensor, and a MEMS temperature sensor on one chip. These individual devices incorporate proof masses, suspensions, humidity sensitive capacitors, and temperature sensitive resistors (thermistors) all fabricated in a common fabrication process that allows them to be integrated onto one micromachined chip. The device can be fabricated in a simple micromachining process that allows its size to be miniaturized for embedded and portable applications. During operation, the sensor suite chip monitors temperature levels, humidity levels, and acceleration levels in two axes. External circuitry allows sensor readout, range selection, and signal processing.

17 Claims, 9 Drawing Sheets

Figures 8A-I

MEMS SENSOR SUITE ON A CHIP

REFERENCE TO RELATED APPLICATIONS

This application claims priority to Provisional Patent Application U.S. Ser. No. 60/619,421, entitled "MEMS Sensor Suite on a Chip" and filed on Oct. 15, 2004, which is fully incorporated herein by reference.

GOVERNMENT LICENSE RIGHTS

This invention was made with Government support under contract number DAAE30-03-C-1076, awarded by the United States Army. The Government has certain rights in the invention.

BACKGROUND

1. Field of the Invention

The present invention relates generally to environmental sensors. More particularly, the present invention relates to micro-electromechanical ("MEMS") humidity sensors, accelerometers, and resistors.

2. Background of the Invention

Embedding miniature sensors in structures, systems, storage and shipping containers, and other items allows the monitoring of those items to determine health, maintenance needs, lifetime, and other item characteristics. In addition, embedded sensors can be used to perform built in test and evaluation of products. Information from miniature accelerometers, temperature sensors, and humidity sensors can tell a user whether or not the item has been dropped sufficiently to cause damage, experienced temperature extremes beyond specifications, or seen humidity levels beyond those that can be handled. A multifunction sensor suite can be used to collect these environmental parameters, which can then be stored and analyzed by a monitoring system, test stand, or other external device.

Current embedded sensor systems that perform this type of monitoring typically use sets of discrete sensor devices on a printed circuit board to form the sensor suite. The devices are typically individually packaged and interconnected to external electronics using printed circuit board traces. However, this approach limits the miniaturization of the sensor suite. The individual packages take up a lot of space, as do the relatively large circuit traces on a printed circuit board. Monolithic integration of sensors allows size reductions by removing the need for individual packaging for each sensor, as well as utilizing finer electrical interconnects.

Most of the previous work on monolithically integrated sensors has focused on combining two sensor types onto the same chip. Typically, both an accelerometer and a temperature sensor, or both a temperature sensor and humidity sensor, may be monolithically integrated, but not all three. A number of designs and fabrication processes have been employed to perform the integration of two sensors. However, integrating all three sensing functions of accelerometers, temperature sensors, and humidity sensors (or integrating the two sensing functions of accelerometers and humidity sensors) is much more difficult. Integration challenges lie in the sensor design, sensor fabrication, and sensor packaging.

The challenges are due to the sensor devices having substantially different functionality. In particular, the accelerometer requires a suspended inertial mass whereas a humidity sensor requires a material or structure that changes depending on humidity levels. These features often require widely different microfabrication approaches and techniques. Furthermore, a fundamental difference between accelerometers, temperature sensors, and humidity sensors is that the accelerometers and temperature sensors do not need to be exposed to the ambient air or gas. In contrast, humidity sensors need to be exposed to the external environment, as do chemical and biological sensors as well. Integrating exposed sensors and sensors that should not be exposed is difficult from a packaging perspective.

As embedded sensor systems are miniaturized and incorporated into applications, the requirement to use integrated sensor suites becomes more important. It would therefore be desirable to combine accelerometers, temperature sensors, and humidity sensors in a small form factor.

SUMMARY OF THE INVENTION

It is therefore an object of the present invention to provide multiple MEMS sensors on one chip for embedded sensing systems through a new sensor fabrication process, and associated sensor designs. The present invention achieves this goal by fabricating on a common substrate up to three different types of MEMS sensors. The three types of sensors are a three-axis accelerometer, a temperature sensor, and a humidity sensor. The accelerometer consists of a proof mass, suspension system, anchors, and capacitive position sensors. An external acceleration moves the proof mass against the suspension, thereby changing the capacitance of the position sensors. The temperature sensor consists of a doped silicon resistor with a resistance that is sensitive to temperature. Temperature changes will modify the resistance of the structure, which can then be measured by external circuitry. The humidity sensor consists of a humidity sensitive polymer layer sandwiched between two parallel-plate electrodes. Varying levels of humidity will alter the volume and dielectric constant of the polymer layer, which is then read by placing a modulated voltage across the electrodes. These three sensors are integrated on a common substrate and can be placed in a package that leaves the humidity sensor exposed to the environment through a filter structure.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein.

These and other embodiments of the present invention will also become readily apparent to those skilled in the art from the following detailed description of the embodiments having reference to the attached figures, the invention not being limited to any particular embodiment(s) disclosed.

Figure 1:
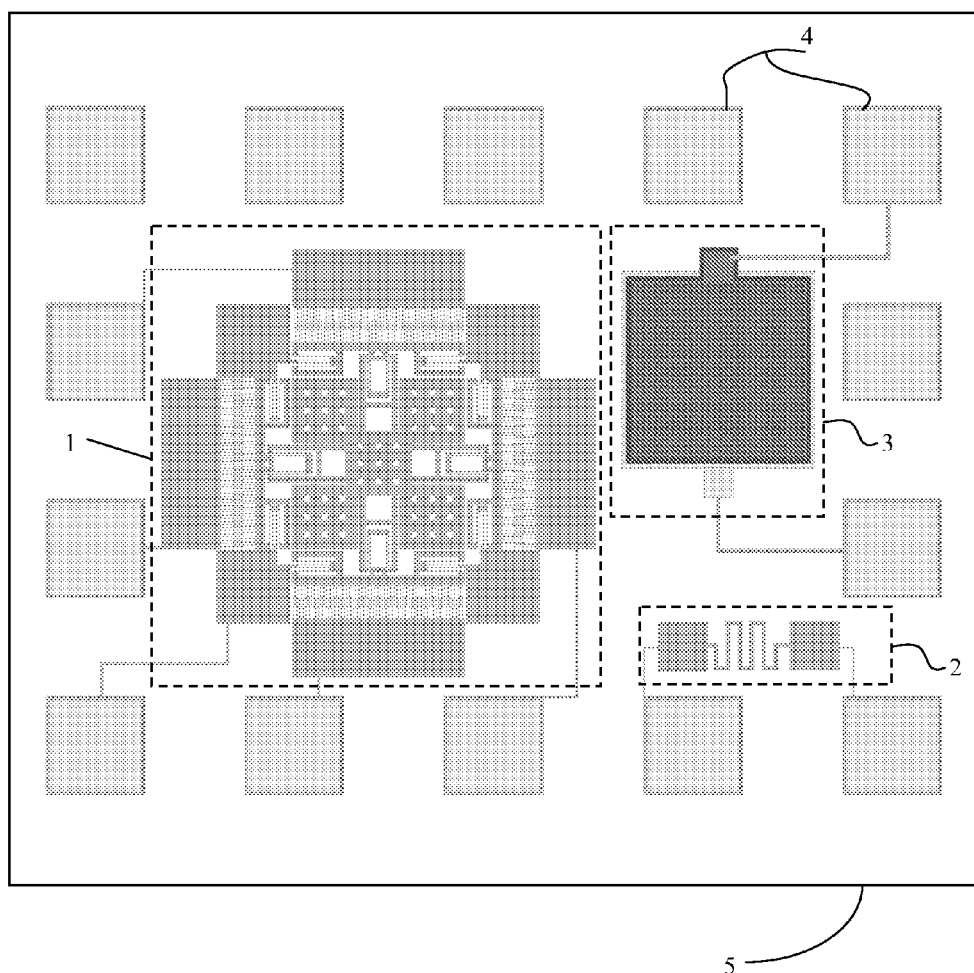
FIG. 1 is a top view of one embodiment of the invention comprising the three sensor types on one chip.

Repeat use of reference characters throughout the present specification and appended drawings is intended to represent the same or analogous features or elements of the invention

DETAILED DESCRIPTION

The present invention and its advantages are best understood by referring to the drawings. The elements of the drawings are not necessarily to scale, emphasis instead being placed upon clearly illustrating the principles of the invention.

The illustrated embodiment of the invention is fabricated in a thick layer of silicon or other conductor material. Within this thick layer of material, the proof masses, flexures, capacitive position sensors, isolated resistors, humidity sensitive capacitors, and multiple anchors and pads are fabricated. FIG. 1 shows one configuration of these structures that yields a sensor suite with a two-axis accelerometer 1, a temperature sensor 2, and a humidity sensor 3. The three sensors occupy an area on the substrate surface 5 of about 0.5 square centimeters or less. Bonding pads 4 provide electrical connection to the three sensors.

The Accelerometer

Figure 2:
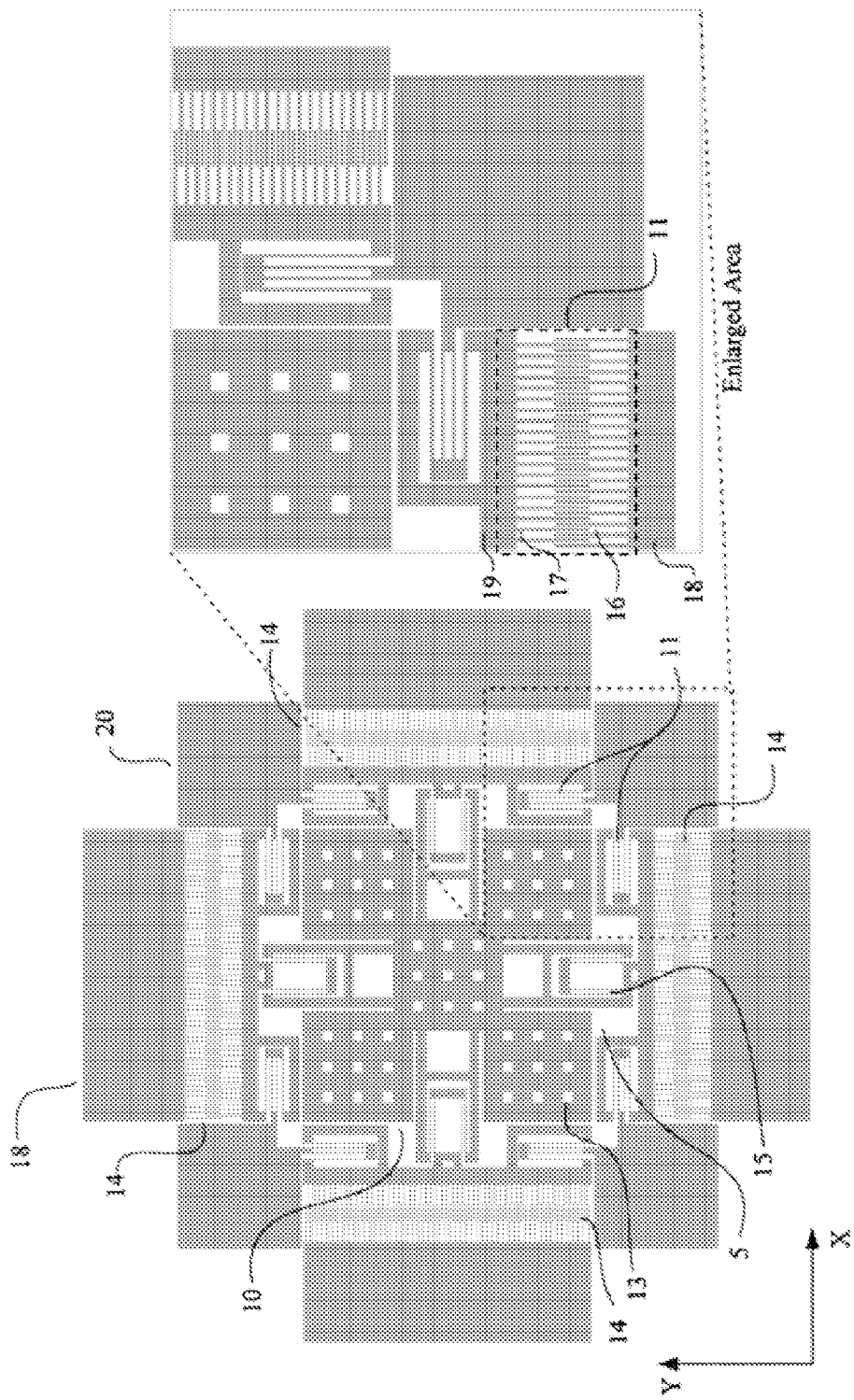
FIG. 2 is a top view of the accelerometer sensor.

FIG. 2 shows one embodiment of the device's accelerometer, in which a moveable proof mass 10 responds to acceleration by deflecting the suspension flexures 11 suspending the proof mass 10 above the substrate surface 5. When an acceleration is applied to the proof mass 10, it will move in the +/−x, +/−y, or +/−z directions, in accordance with the direction of the acceleration, a distance that depends on the acceleration level, the amount of time the acceleration is applied, the size of the proof mass 10, and the compliance of the suspension in that direction. This motion results in a deflection of the capacitive position sensors 14 in the x and/or y directions, and a change to the capacitance of those sensors. These deflections are proportional to the level of acceleration seen and can be measured by measuring the capacitance of the sensors.

With reference to FIG. 2, the proof mass 10 is fabricated with holes 13 which are utilized during the fabrication process to allow chemicals to pass through to the substrate surface 5. Four (4) suspension anchors 20 anchor eight (8) suspension flexures 11 located at the corners of the proof mass 10. As can be seen in FIG. 2, four (4) of the suspension flexures allow displacement of the proof mass 10 in the x-direction and four (4) of the suspension flexures allow displacement of the proof mass 10 in the y-direction. Four (4) central flexures 15 decouple lateral motion of the proof mass 10 from the four (4) capacitive position sensors 14. The capacitive position sensors 14 are comprised of a row of static comb-fingers 16 that are cantilevered to the comb-finger anchors 18 that are connected to the substrate surface 5, and an interlocking (but not contacting) row of dynamic comb-fingers 17 that are attached to the flexure support 19. As can be seen in FIG. 2, the components of the accelerometer 1 are "mirror-imaged" about the x- and y-axis in this embodiment.

Figure 3:
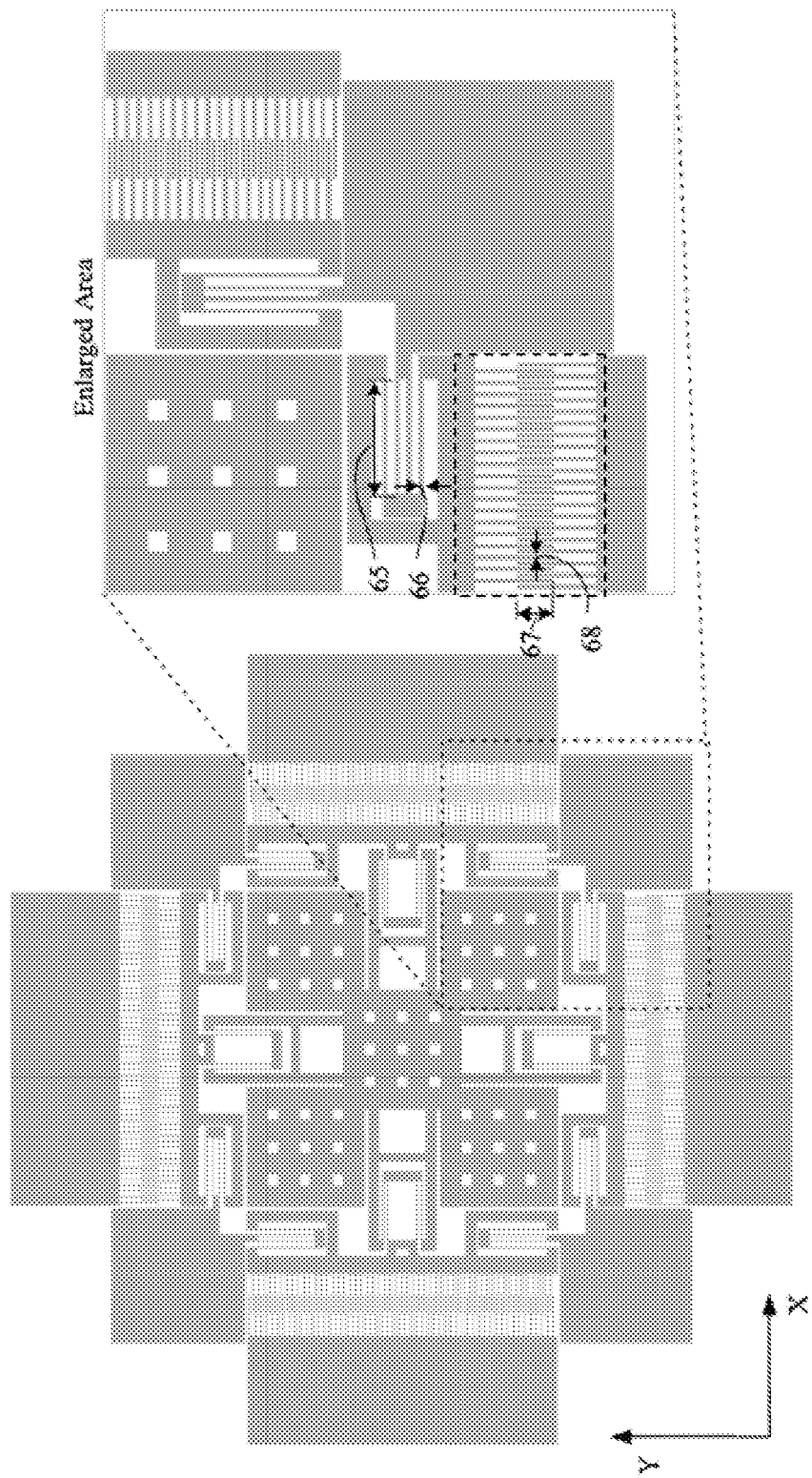
FIG. 3 shows the definition of parameters used in the design of the accelerometer.

FIG. 3 shows the definition of the primary parameters used to design the accelerometer to detect specific levels of acceleration. The inertial force developed on the proof mass is then given by:

$$F = m*a,$$

where F is the inertial force, m is the mass of the proof mass, and a is the applied acceleration.

The stiffness of the suspension provides a force against the inertial force. The stiffness in each axis of the device is given by:

$$k = 6*kb = \frac{2*E*t*wb^3}{lb^3},$$

where k is the entire suspension stiffness, kb is the stiffness of one beam in the suspension, E is the Young's modulus of the material the device is made of, wb is the width 66 of a beam in the suspension, lb is the length 65 of a beam in the suspension, and t is the thickness of the material.

The distance the proof mass will move under the applied acceleration is given by:

$$\Delta y = \frac{F}{k}$$

The capacitive position sensor capacitance will change with deflection of the proof mass. The capacitance change is given by:

$$\Delta C = \frac{\varepsilon_o * N * t * \Delta y}{g_o}$$

where C is the comb-drive capacitance, $\varepsilon_o$ is the permittivity of free space, N is the number of fingers in the comb-drive, t is the thickness of the structure, $l_o$ is the initial overlap 67 of the fingers, y is the amount of deflection, and $g_o$ is the gap 68 between fingers in the comb-drive. Typical capacitive measurement circuits can measure capacitance changes on the order of $10^{-18}$ Farads.

The Temperature Sensor

Figure 4:
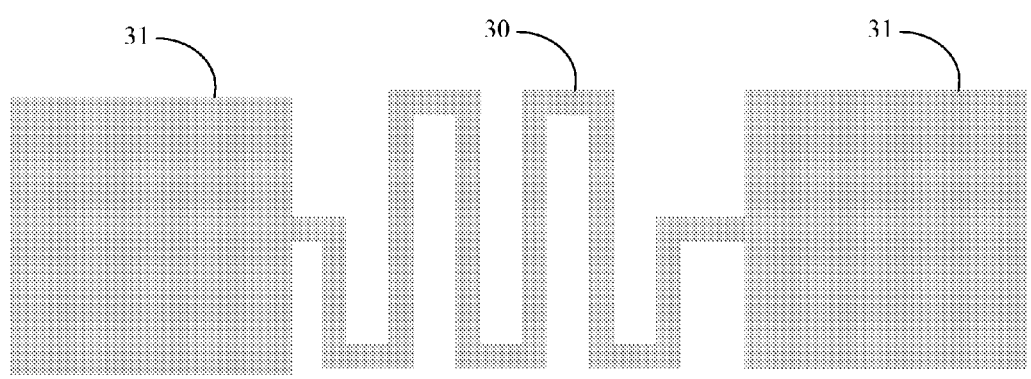
FIG. 4 is a top view of the temperature sensor.

FIG. 4 shows the temperature sensor that is comprised of a serpentine bridge 30 composed of doped silicon with a large temperature coefficient of resistance. The serpentine bridge 30 forms a thermistor that has a nominal resistance at ambient temperature that depends on the bridge geometry. As the external temperature changes, the resistance of the bridge 30 will change. Electrical contact with the resistor is made via bond pads 31. A number of readout techniques can be utilized to measure that resistance change.

Figure 5:
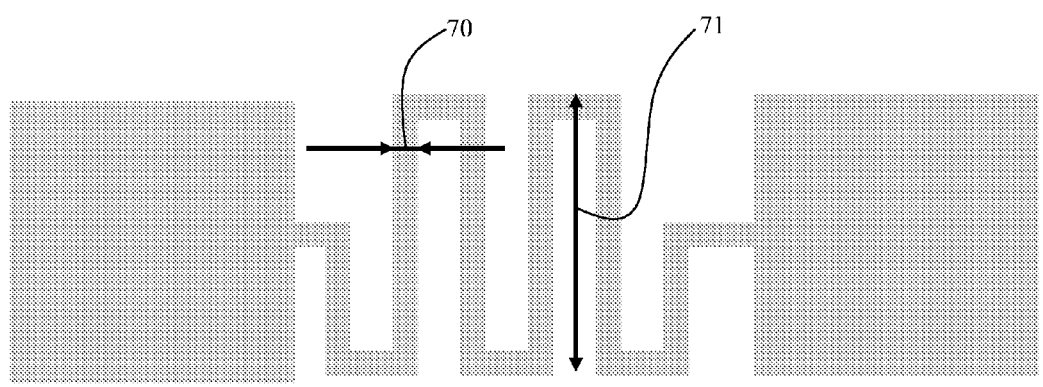
FIG. 5 shows the definition of parameters used in the design of the resistor.

FIG. 5 shows the definition of the primary parameters used to design the temperature sensors. The nominal resistance of the thermistor depends on the cross-sectional area of the device, the full device length, and the resistivity of the material, and is given by:

$$R_o = \frac{\rho * t * w}{L}$$

where $R_o$ is the resistance at ambient temperature, $\rho$ is the material resistivity, t is the thickness of the material, w is the width 70 of the resistor, and L is the length of the resistor (i.e., the total length of all of the segments of length $L_o$ 71).

For a temperature sensitive resistor, the resistance as a function of temperature is given by:

$$R = R_o*(1+\alpha(T-T_o)),$$

where R is the resistance at temperature, T, $R_0$ is the resistance at ambient temperature, α is the temperature coefficient of the resistor material, and $T_o$ is ambient temperature. Typical resistance measurement circuits can determine milliOhm changes in resistance.

The Humidity Sensor

Figure 6:
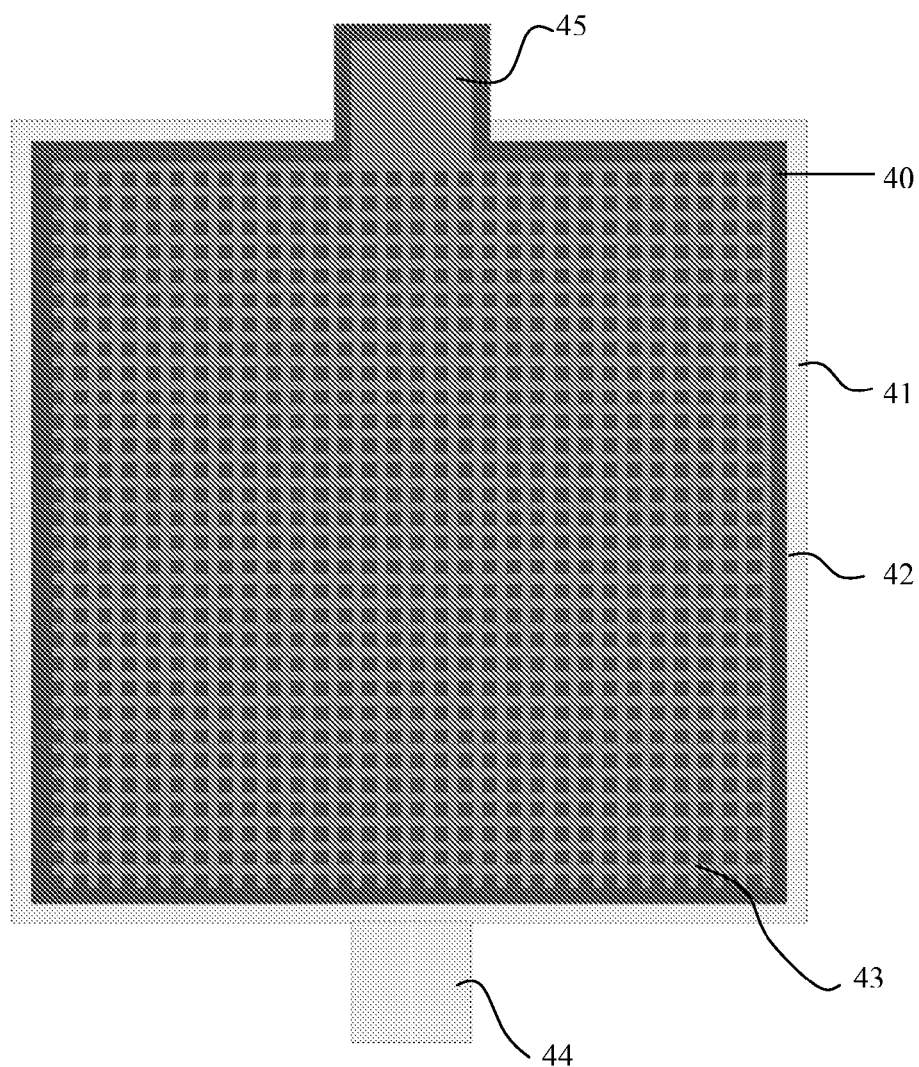
FIG. 6 is a top view of the humidity sensor.

FIG. 6 illustrates the humidity sensor for the sensor suite, a parallel-plate capacitor with a humidity sensitive dielectric. The humidity-sensitive layer 40 is deposited above a bottom metal electrode 41. A top metal electrode 42 is then deposited and patterned on the humidity sensitive layer 40. That top metal layer is the top electrode, and is also patterned with a mesh 43 so as to allow the water vapor in the atmosphere to interact with the dielectric. Bond pads 44 and 45 provide electrical contact to the electrodes of the sensor. As humidity changes, the dielectric constant of the humidity sensitive polymer changes. As this parameters change, the capacitance of the sensor will also change. This can be measured using a capacitive sensing circuit well known in the art of humidity sensing devices.

For the humidity sensor capacitor, the nominal capacitance depends on the area of the capacitor, A, the thickness of the dielectric layer, d, the permittivity of free space, $\epsilon_o$, and the nominal relative permittivity of the dielectric between the electrodes, $\epsilon_r$, and is given approximately by:

$$C_o = \frac{\varepsilon_o \varepsilon_r A}{d}$$

In the presence of humidity, the polymer layer will absorb water vapor. The dielectric constant of water is approximately $\epsilon_w$=80, while that of the polymer layer is approximately $\epsilon_p$=3.5. This substantial difference in dielectric constant results in a change to the capacitance of the structure when in the presence of humidity. In the presence of humidity, the relative permittivity of the dielectric between the electrodes is given by a weighted average of the relative permittivities of the constituents:

$$\epsilon_r = f_w * \epsilon_w + f_p * \epsilon_p,$$

where $f_w$ and $f_p$ are the volume fraction of each component. Furthermore, in general:

$$1 = f_w + f_p,$$

and therefore $$\epsilon_r = \epsilon_p + f_w * (\epsilon_w - \epsilon_p),$$

and $$C = \frac{\varepsilon_o A}{d} * (\varepsilon_p + f_w * (\varepsilon_w - \varepsilon_p)).$$

Therefore, the capacitance of the structure will be linear with the volume fraction absorption of water into the polymer. For the polymer used in one embodiment (PI2723 polyimide), the volume fraction absorption of water is 4% at 100% relative humidity, and 0% relative humidity, yielding an absorption of 0.04% per 1% RH. Other types of polymers could be used for the humidity sensitive layer of the capacitor depending upon the amount of water absorption that is desired. As can be seen from the above equations, the thickness of the layer of humidity sensitive polymer will vary depending upon the absorption rate of the polymer selected.

Figure 7:
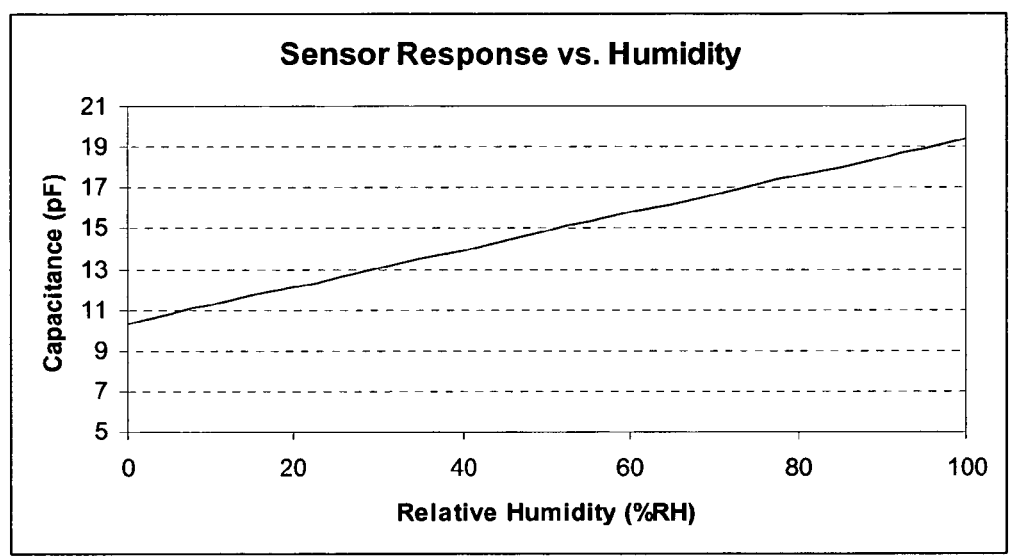
FIG. 7 shows the humidity sensor's capacitive response as a function of humidity level.

FIG. 7 shows the theoretical sensor response as a function of humidity level. As can be seen in FIG. 7, nominal capacitance of 10 pF at 0% RH increases linearly to 20 pF at 100% RH. Typical capacitance measurement circuits can measure capacitance changes on the order of $10^{-18}$ Farads, making this amount of capacitance change easy to detect.

The Fabrication Technique

FIGS. 8A through 8I illustrate the steps in the microfabrication process for one embodiment of the invention. This embodiment of the sensor suite is fabricated using a silicon-on-insulator ("SOI") microfabrication process.

Figure 8:
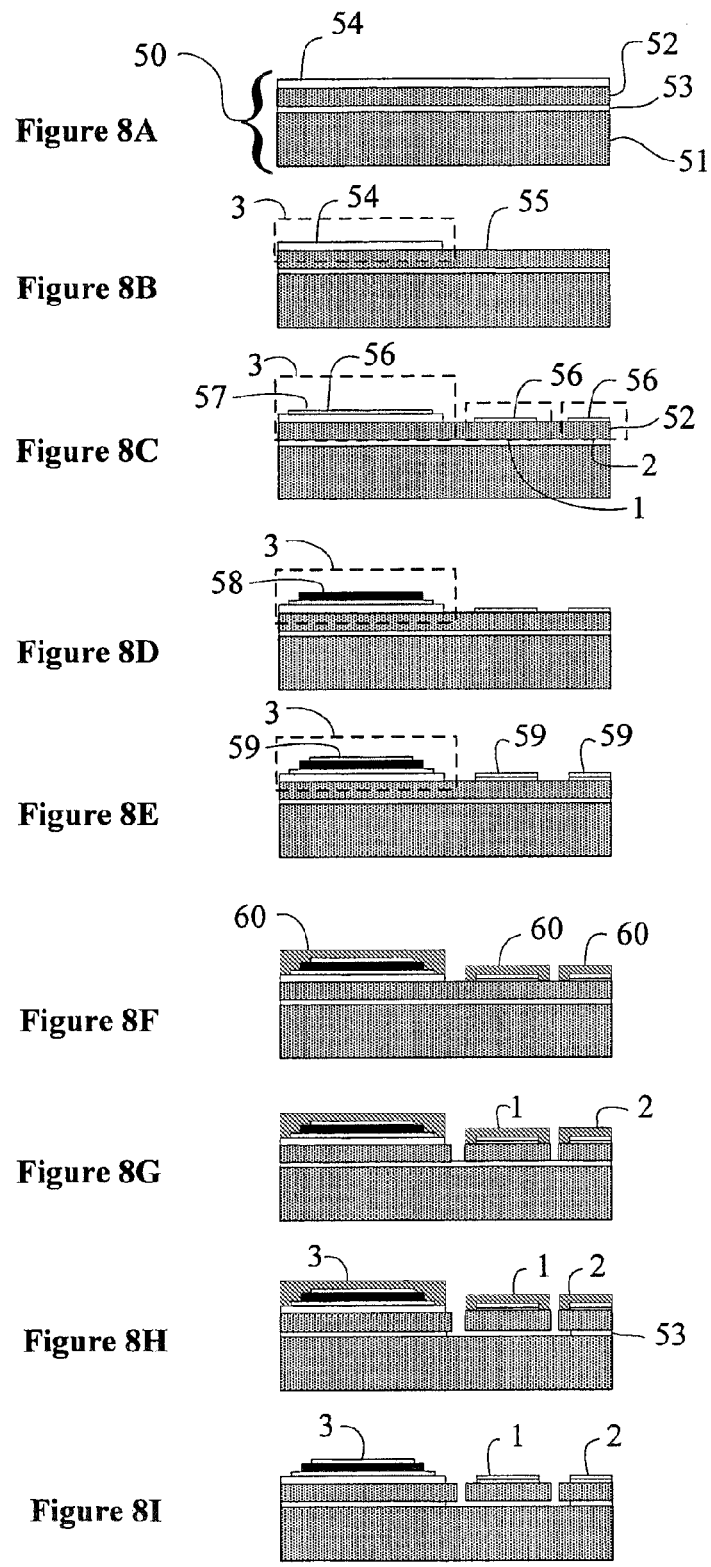
FIGS. 8A-I illustrate the steps in the fabrication process for a three-sensor chip.

Referring to FIG. 8A, the starting material is a silicon-on-insulator wafer 50 with a handle layer 51 and a 15-micron thick active silicon layer 52 separated by a 2 micron thick silicon dioxide layer 53. In addition, a thin coat of isolating oxide 54 is deposited on the top of the wafer 50 for the purpose of isolating the humidity sensor from the substrate. A 0.3 micron thickness of isolating oxide has been used in one embodiment, though other thicknesses could also be employed.

The areas on the wafer 50 in which the accelerometer 1, temperature sensor 2 and humidity sensor 3 will be fabricated are shown in FIGS. 8B and 8C. As illustrated in FIG. 8B, the wafer 50 is patterned to open areas in the isolation oxide 54. These openings 55 will be areas to which electrical contact and structure definition for the accelerometer 1 and temperature sensor 2 can occur. Then, a metal layer 56 is deposited and patterned as shown in FIG. 8C. This metal layer 56 makes contact to the silicon layer 52 through the openings in the oxide 54 where desired for the accelerometer and temperature sensors, and is also used to form the bottom electrodes 57 of the humidity sensor 3. After the first metal layer is complete, the humidity sensitive polyimide 58 is deposited on the humidity sensor area 3 and patterned and cured, as shown in FIG. 8D. After that step is complete, a second metal layer 59 is deposited, as shown in FIG. 8E. This metal layer serves as the top electrode of the humidity sensitive capacitor 3 and can also be used to add another layer of metal to the bond pads for the accelerometer 1 and temperature sensor 2, if desired. At this point, the humidity sensor 3 is complete.

After completing the humidity sensor, a coating of silicon nitride 60 is deposited and patterned to completely encapsulate all exposed metal, as shown in FIG. 8F. This encapsulating layer is required to protect the metal layers during the subsequent silicon and silicon dioxide etches. Plasma enhanced chemical vapor deposition ("PECVD") silicon nitride was used in one embodiment to minimize the existence of pinholes that would allow damage to the isolated components during etching. PECVD silicon nitride also uses lower temperatures and therefore minimizes stress on the sensors during processing. Other processes could be used instead to manufacture the silicon nitride, however, provided that the resultant coating minimizes pinholes.

As illustrated in FIG. 8G, the SOI wafer is then patterned using standard lithography and etched via a deep silicon reactive ion etch ("DRIE") to define the structures of the accelerometer 1 and resistor 2. A Bosch DRIE process was used in one embodiment of the invention, though other DRIE processes could be used instead.

Referring to FIG. 8H, after defining the silicon structure, the silicon dioxide layer 53 in between the silicon layers is removed in a fashion that releases the moving parts of the accelerometer 1 structure but allows portions of the layer 53, specifically those underneath the humidity sensor 3, the resistor 2, and anchors and bond pads (not illustrated) on the accelerometer 1, to remain and hold the structure to the substrate. After the structure is released, the entire silicon nitride layer 60 is removed, as shown in FIG. 8I, thereby completing processing of the device.

Although the process discussed above incorporated one accelerometer, one resistor and one humidity sensor, any combinations of the three sensors on one chip that includes at least an accelerometer and a humidity sensor on one chip would be within the scope of the present invention.

The sensor suite is connected to external electronics well known in the art of sensor systems that provide an oscillator that produces a modulation signal for monitoring the capacitors, a demodulator for detecting the capacitance-induced modulation of that signal, a current source to run through the thermistor, and amplifiers and filters to condition the signal. The electronics can be integrated in an application specific integrated circuit for further miniaturization.

Using typical capacitance and resistance measurement circuits capable of monitoring changes in capacitance on the order of $10^{-18}$ Farads and changes in resistance on the order of milliOhms, the ranges and resolutions for the sensors given the specific set of design parameters are shown in Table 1 below.

TABLE 1

Typical Resolutions and Ranges of the Sensors

| Sensor | Width of Proof Mass or Humidity Sensor (µm) | Length of Proof Mass or Humidity Sensor (µm) | Thickness t (µm) | wb or w (µm) | lb or L (µm) | Resolution | Range |
|---|---|---|---|---|---|---|---|
| Accelerometer | 500 | 500 | 15 | 5 | 500 | 0.2 g | ±1500 g |
| Temperature | N/A | N/A | 15 | 5 | 500 | 0.5° C. | −40° C. to 250° C. |
| Humidity | 1000 | 1000 | 3 | N/A | N/A | 0.1% | 0-100% RH |

The initial intent of this invention was to miniaturize sensing devices in multifunctional embedded data acquisition systems, diagnostic devices, and test & evaluation systems. However, the device could also be used in standalone applications where the sensor suite is connected to an RFID tag or other transmitter for remote determination of the environment seen by shipping containers and products.

Figure 9:
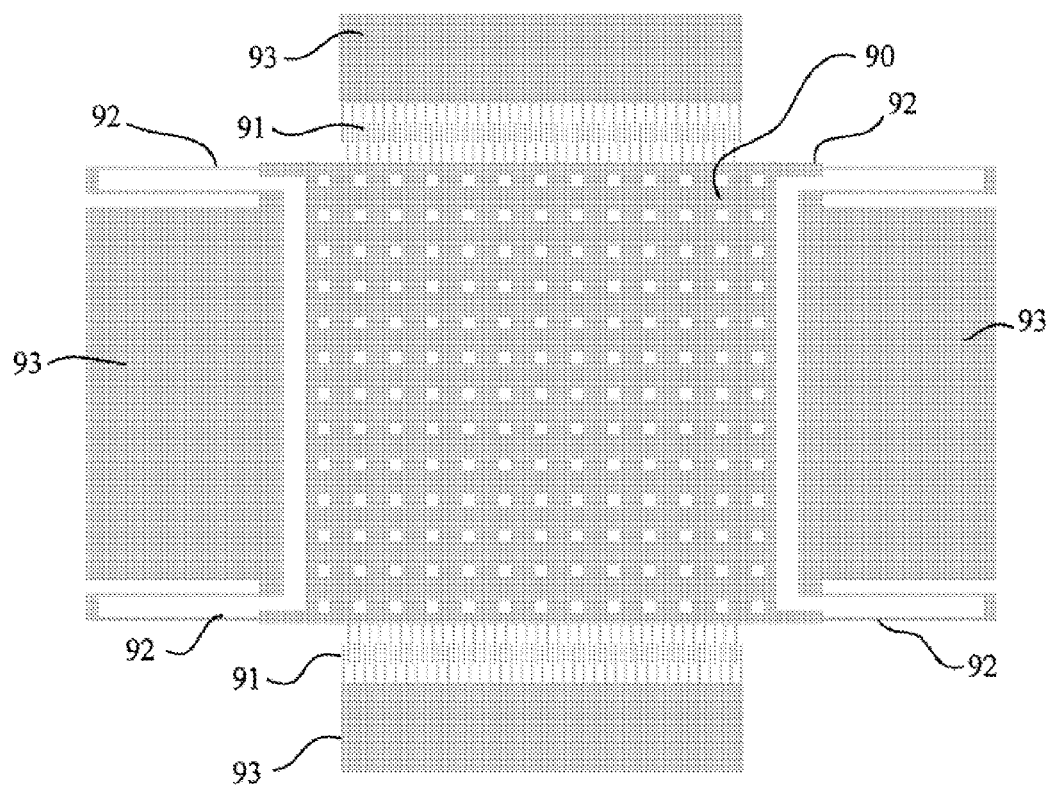
FIG. 9 illustrates an alternative embodiment of the MEMS sensor suite accelerometer.

Although the current embodiment and some other potential embodiments and forms of this invention have been illustrated, it is apparent that other various modifications and embodiments of the invention can be made by those skilled in the art without departing from the scope and spirit of the present invention. For example, alternative designs of the accelerometer may be utilized including single axis versions such as the embodiment shown in FIG. 9, which incorporates a proof mass 90, capacitive position sensors 91, suspension flexures 92, and anchors 93. In other embodiments the chemical sensor could be configured as a chemical sensor depending on the specific formulation and characteristics of the polymer used in its creation.

What is claimed is:

1. A method of fabricating a micro-electromechanical sensors suite, comprising the steps of:
    depositing and patterning an isolating material on a silicon-on-insulator wafer;
    depositing and patterning a first conductor on the isolating material to form a bottom electrode;
    depositing a humidity sensitive polymer on the bottom electrode;
    depositing a second conductor to form a top electrode;
    depositing and patterning a protective layer to protect the first and second metal layers;
    etching the wafer to define an accelerometer comprising a proof mass;
    releasing the accelerometer from the wafer such that the proof mass becomes moveable;
    removing the protective layer.

2. The method of claim 1, the protective layer comprising silicon nitride.

3. The method of claim 1, further comprising the steps of: etching a mesh pattern in the top electrode.

4. The method of claim 1, further comprising the steps of:
    forming a second bottom electrode;
    depositing a chemical sensitive polymer on the second bottom electrode; and,
    forming a second top electrode on the chemical sensitive polymer.

5. The method of claim 1, further comprising: forming a plurality of capacitive position sensors, the capacitive position sensors being capable of measuring deflection of the proof mass along a single axis.

6. The method of claim 1, further comprising: forming a plurality of capacitive position sensors, the capacitive position sensors being capable of measuring deflection of the proof mass along two axes.

7. The method of claim 1, further comprising the steps of: forming a plurality of capacitive position sensors, the capacitive position sensors being capable of measuring deflection of the proof mass along three axes.

8. The method of claim 1, further comprising the steps of:
    patterning and etching a thermal sensor, the thermal sensor being a thermistor; and,
    doping the thermistor.

9. The method of claim 8, the thermistor being fabricated in a serpentine shape.

10. The method of claim 1, the humidity sensitive polymer comprising polyimide.

11. A method of fabricating a micro-electromechanical sensors suite, comprising the steps of:

depositing and patterning an isolating material on a silicon-on-insulator wafer, the silicon-on-insulator wafer comprising a top silicon layer and an insulator layer, the top silicon layer disposed above the insulator layer, whereby a first sensor region is formed;

depositing and patterning a first metal layer on the isolating material, within the first sensor region, to form at least one bottom electrode;

depositing and patterning a dielectric material on each of the bottom electrodes;

depositing and patterning a second metal layer above the dielectric material to form at least one top electrode;

depositing and patterning a protective layer, whereby the first sensor region is protected from subsequent processing steps;

patterning and etching the wafer top silicon layer to define a thermal sensor and an accelerometer within a second sensor region, the thermal sensor comprising a thermistor fabricated from the top silicon layer, the accelerometer comprising:

a proof mass, the proof mass fabricated from the top silicon layer;

at least one suspension flexure, each suspension flexure being operatively connected to the proof mass and fabricated from the top silicon layer, whereby the at least one suspension flexure allows the proof mass to move in response to acceleration;

at least one anchor, each anchor being operatively connected to each suspension flexure and fabricated from the top silicon layer, whereby each anchor connects each suspension flexure to the silicon-on-insulator wafer; and, at least one capacitive position sensor capable of measuring proof mass displacement; and, doping the thermistor, whereby the temperature coefficient of resistance of the thermistor is increased;

removing the insulator layer under the proof mass, thereby releasing the proof mass from the wafer such that the proof mass becomes moveable; and, removing the protective layer from the first sensor region.

12. The method of claim 11, the protective layer comprising silicon nitride.

13. The method of claim 12, the humidity sensitive polymer comprising polyimide.

14. The method of claim 11, the dielectric material on at least one of the bottom electrodes comprising a humidity sensitive polymer.

15. The method of claim 11, the dielectric material on at least one of the bottom electrodes comprising a chemical sensitive polymer.

16. The method of claim 11, further comprising: etching a mesh pattern in the top electrode.

17. The method of claim 11, the thermistor being fabricated in a serpentine shape.

* * * * *